(12) United States Patent
Hasegawa

(10) Patent No.: US 6,595,794 B2
(45) Date of Patent: Jul. 22, 2003

(54) ELECTRICAL CONTACT METHOD AND APPARATUS IN SEMICONDUCTOR DEVICE INSPECTION EQUIPMENT

(75) Inventor: Yoshiei Hasegawa, Kanagawa-ken (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 80 days.

(21) Appl. No.: 09/799,855

(22) Filed: Mar. 5, 2001

(65) Prior Publication Data

US 2001/0027053 A1 Oct. 4, 2001

(30) Foreign Application Priority Data

Mar. 29, 2000 (JP) .................................... 2000-091138
Apr. 24, 2000 (JP) .................................... 2000-122912
Nov. 16, 2000 (JP) .................................... 2000-349401

(51) Int. Cl.$^7$ .............................................. H01R 11/18
(52) U.S. Cl. ...................... 439/482; 324/754; 324/761
(58) Field of Search ............................ 324/754, 761, 324/765, 755; 439/771, 482

(56) References Cited

U.S. PATENT DOCUMENTS

| | | | |
|---|---|---|---|
| 5,367,165 A | * 11/1994 | Toda et al. | ................. 250/306 |
| 5,499,924 A | * 3/1996 | Arisaka et al. | ................. 439/67 |
| 6,016,060 A | * 1/2000 | Akram et al. | ................. 324/757 |
| 6,028,436 A | * 2/2000 | Akram et al. | ................. 324/755 |
| 6,033,235 A | * 3/2000 | Ikeya | ........................... 439/71 |
| 6,070,785 A | * 6/2000 | Ameen et al. | ............... 228/115 |
| 6,291,897 B1 | * 9/2001 | Wark et al. | ................. 257/786 |
| 6,362,637 B2 | * 3/2002 | Farnworth et al. | .......... 324/755 |
| 6,426,642 B1 | * 7/2002 | Akram et al. | ............... 324/765 |
| 6,429,671 B1 | * 8/2002 | Duckworth et al. | ........ 324/758 |

* cited by examiner

Primary Examiner—Khiem Nguyen
Assistant Examiner—Thanh-Tam Le
(74) Attorney, Agent, or Firm—Graybeal Jackson Haley LLP

(57) ABSTRACT

An electrical contact technique for use in the semiconductor device inspection equipment is disclosed. There are used one or more pyramid-shaped contactors projecting toward an objective semiconductor device to be tested. The contactor is brought into contact with the projection electrode of the objective semiconductor device through the edge line or the slant surface thereof. Accordingly, only the side portion of the projection electrode is pressed by the edge line or the slant surface of the contactor, thus the projection electrode being prevented from being damaged at the tip portion thereof.

11 Claims, 18 Drawing Sheets

ELECTRICAL CONTACT METHOD AND APPARATUS IN SEMICONDUCTOR DEVICE INSPECTION EQUIPMENT

This application claims priority to Japanese patent application numbers 2000-091138 filed Mar. 29, 2000, 2000-122912 filed Apr. 24, 2000, and 2000-349401 filed Nov. 16, 2000, under 35 USC 119.

BACKGROUND OF THE INVENTION

1. Field of the Invention

The present invention relates to a method and apparatus for bringing a contactor into electrical contact with a projection electrode of a semiconductor device in a semiconductor device inspection equipment.

2. Prior Art

Generally, a semiconductor device such as an integrated circuit (referred to as "IC" hereinafter) is electrically tested with the help of an electrical contact apparatus such as a probe card, an IC socket, or the like in order to examine if the circuit satisfactorily works according to a design specification as declared. Such an electrical test is usually carried out at several stages, for instance, at the stage where each semiconductor chip still stays on a semiconductor wafer, at the stage after the chip is cut off from the wafer, and at the stage after the chip is molded. The electrical contact apparatus is provided with a plurality of contactors which are pressed on a predetermined electrode of the chip during the test.

In case of a semiconductor device such as a Chip-Scale-Package (CSP), Ball-Grid-Array (BRG), or the like, using a hemispheric projection electrode (i.e. bump electrode) projecting on the side of the electrical contact apparatus as an electrode of the chip, it is a significant matter that the contactor never gives any damage to the projection electrode at the time of the electrical test of the chip. Especially, when the projection electrode is made of a soft material like solder, it has to be handled carefully. If the tip portion of the projection electrode is crushed, the height (projection height) of the projection electrode becomes different from electrode to electrode, so that at the time of the packaging the semiconductor chip, its projection electrode might often fail to rightly come in contact with the wiring arranged on the base plate.

As one technique for bringing the contactor into contact with the hemispherical projection electrode, it has been proposed to use a contactor formed in the shape of a pyramid, a cone, or a needle and to press the sharp tip portion thereof on the projection electrode.

As the other technique for bringing the contactor into contact with the hemispherical projection electrode, it has been proposed to use a contactor having a contact surface in the shape of a ring and to press that ring surface of the contactor on the projection electrode.

However, according to the one technique as describe above, since the tip portion of the contactor is pressed on the projection electrode of the semiconductor device side, the sharp tip portion of the contactor is stuck into the projection electrode, so that the tip portion of the projection electrode is damaged, and every projection electrode comes to have a different height.

On the other hand, according to the other technique as described above, since the ring-shaped contact surface of the contactor is pressed on the projection electrode on the side of the semiconductor device, the base portion of the projection electrode is crushed by the contact surface. As a result, the tip portion of the projection electrode might not be damaged, but every projection electrode still comes to have a different height.

Therefore, an object of the invention is to prevent the projection electrode of the semiconductor device from being damaged by the contactor as much as possible at the time of electrical test of the semiconductor device.

SUMMARY OF THE INVENTION

An electrical contact method according to the invention as used in a semiconductor device inspection equipment comprises the steps of preparing an electrical contact device having one or more pyramid-shaped contactors projecting toward the semiconductor device, and bringing the edge line or the slant surface of the above pyramid-shaped contactor into contact with the corresponding projecting electrode of the semiconductor device.

An electrical contact apparatus according to the invention as used in a semiconductor device inspection equipment includes a plate-like or filmy base and one or more pyramid-shaped contactors provided in correspondence with the projection electrode and projecting from the one surface side of the above base toward the semiconductor device. The above pyramid-shaped contactor is displaced, with respect to the corresponding projection electrode, in a predetermined direction in a plane parallel to the above base.

The slant surface indicates a slant surface portion other than the bottom surface of a polygonal pyramid. The edge line is defined as a boundary line formed between adjacent slant surfaces. Both of the slant surface and the edge line converges to the tip portion (apex) of the polygonal pyramid.

Since the edge line and the slant surface of the pyramid-shaped contactor make an angle with respect to the center axis of the projection electrode of the semiconductor device, neither the edge line nor the slant surface is pressed on the tip portion of the projection electrode, and they just make contact with the side portion of the projection electrode around and near the tip portion and pushes that contact portion in the state of keeping an angle with respect to the center axis as it is. Therefore, the projection electrode is prevented from being damaged due to the pressure applied by the pyramid-shaped contactor thereto.

The electrical contact apparatus may have one pyramid-shaped contactor against one projection electrode and, also, may have two or more pyramid-shaped contactors for one projection electrode.

A plurality of pyramid-shaped contactors may be arranged such that one of their edge lines or slant surfaces is brought into contact with one projection electrode. With this arrangement, any one of plural pyramid-shaped contactors surely comes in contact with the projection electrode regardless of any difference in size among the projection electrode.

If two or more pyramid-shaped contactors are provided for one projection electrode, these pyramid-shaped contactors provided for every projection electrode are arranged around the center axis of the projection electrode at angular intervals. With this arrangement, the projection electrode certainly comes in electrical contact with the pyramid-shaped contactor regardless of any difference in size among the projection electrode.

Plural pyramid-shaped contactors provided for every projection electrode can be arranged such that the edge line or the slant surface of each contactor comes in contact with the corresponding projection electrode when pressing the contactor on the projection electrode. This can be done, for instance, if each contactor is arranged to direct its edge line or slant surface toward the center axis of the corresponding projection electrode. With this arrangement, the projection electrode certainly comes in electrical contact with the edge line or the slant surface of the pyramid-shaped contactor.

The base can have an opening which is formed in an area inside the arrangement area of the plural pyramid-shaped contactors and is opened to at least the corresponding projection electrode. With this arrangement, since the opening of the base acts as an escape for the tip portion of the projection electrode to run, any damage due to collision between the tip portion of the projection electrode and the base can be prevented.

The electrical contact apparatus further includes one or more wiring portions provided on the base and electrically connected with the pyramid-shaped contactor. These wiring portions are connected with an electrical test circuit by a proper means such as a flat cable, a base plate, and so forth.

One or more pyramid-shaped contactors may be arranged on the base or on the seat portion arranged on the base.

The electrical contact apparatus further includes a base plate provided with a plurality of wiring portions respectively corresponding to the projection electrodes and being exposed at least in part to the one surface side of the base plate. This base has a pyramid-shaped auxiliary contactor formed on the other surface side, and the auxiliary contactor is brought into electrical contact with each corresponding wiring portion of the base plate and also with the pyramid-shaped contactor as well. With this arrangement, the electrical contact apparatus can be formed as a probe card or a socket for use in the electrical test of the semiconductor device.

The electrical contact apparatus further includes a frame arranged on the one surface side of the base plate, and the above base is fitted to the base plate such that the pyramid-shaped contactor is on the frame side.

The frame can have an opening for receiving the semiconductor device. With this, the electrical contact apparatus can be formed as a socket.

The electrical contact apparatus further includes a plate-like spacer arranged between the base and the base plate.

The electrical contact apparatus further includes a rubber plate arranged between the frame and the arrangement place of the auxiliary contactor arranged on the base. With this arrangement, the auxiliary contactor can be pressed on the wiring of the base plate by making use of elasticity of the rubber plate.

The electrical contact apparatus further includes a seat portion arranged on the base and the plural pyramid-shaped contactors corresponding to the projection electrode. These plural pyramid-shaped contactors can be arranged about the center axis of the corresponding projection electrode at angular intervals.

In the electrical contact apparatus as described above, the seat portion projects from the base and has an opening between adjacent pyramid-shaped contactors. Furthermore, the base can have a slit extending around the seat portion.

BRIEF DESCRIPTION OF THE INVENTION

The invention will now be described in detail with reference to the accompanying drawings, in which:

FIG. 1 is a cross-sectional view showing an embodiment of an electrical contact apparatus according to the invention.

FIGS. 2(A) and 2(B) are diagrams showing an embodiment of a probe element used in the electrical contact apparatus shown in FIG. 1, FIG. 2(A) being a cross-sectional view and FIG. 2(B) being a bottom plan view.

FIGS. 3(A) and 3(B) are diagrams showing a second embodiment of a probe element, FIG. 3(A) being a bottom plan view and FIG. 3(B) being a cross sectional view taken along a line 3B—3B in FIG. 3(A).

FIGS. 4(A), 4(B), and 4(C) are diagrams for explaining the relation between a projection electrode and a contactor when using the probe element as shown in FIGS. 3(A) and 3(B), FIG. 4(A) indicating an example of contact marks left on the surface of the projection electrode, FIG. 4(B) indicating the relation between the contactor and various projection electrodes different in size, and FIG. 4(C) indicating the relation between the contactor and the projection electrode when the positional mismatch takes place therebetween.

Figure 7A:
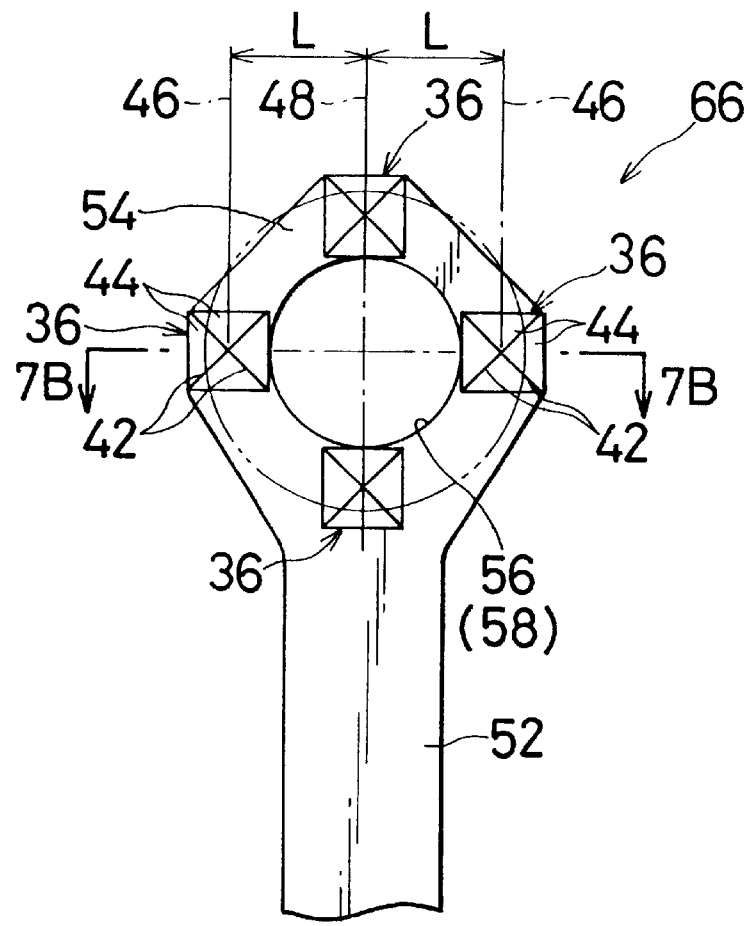
Figure 7B:
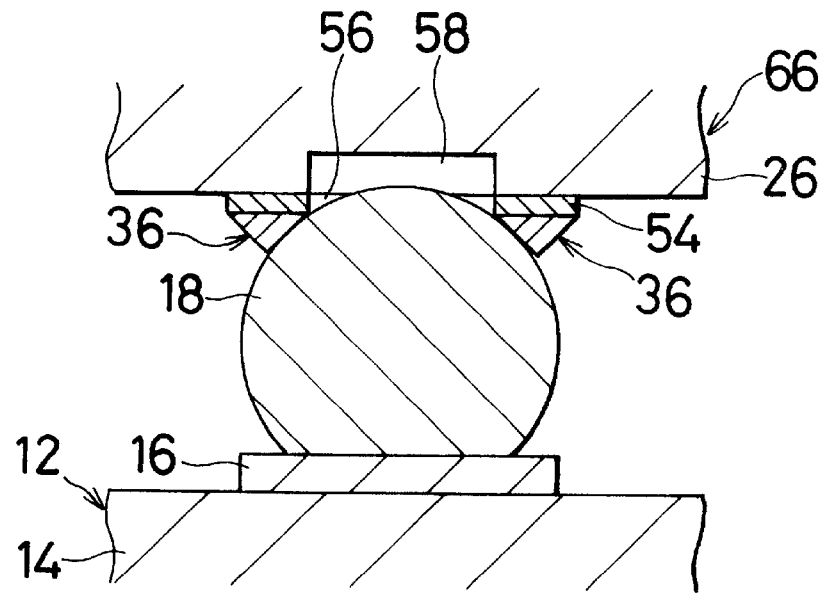

FIGS. 7(A) and 7(B) are diagrams showing a fifth embodiment of the probe element, FIG. 7(A) being a bottom plan view and FIG. 7(B) being a cross-sectional view taken along a line 7B—7B in FIG. 7(A).

Figure 8:
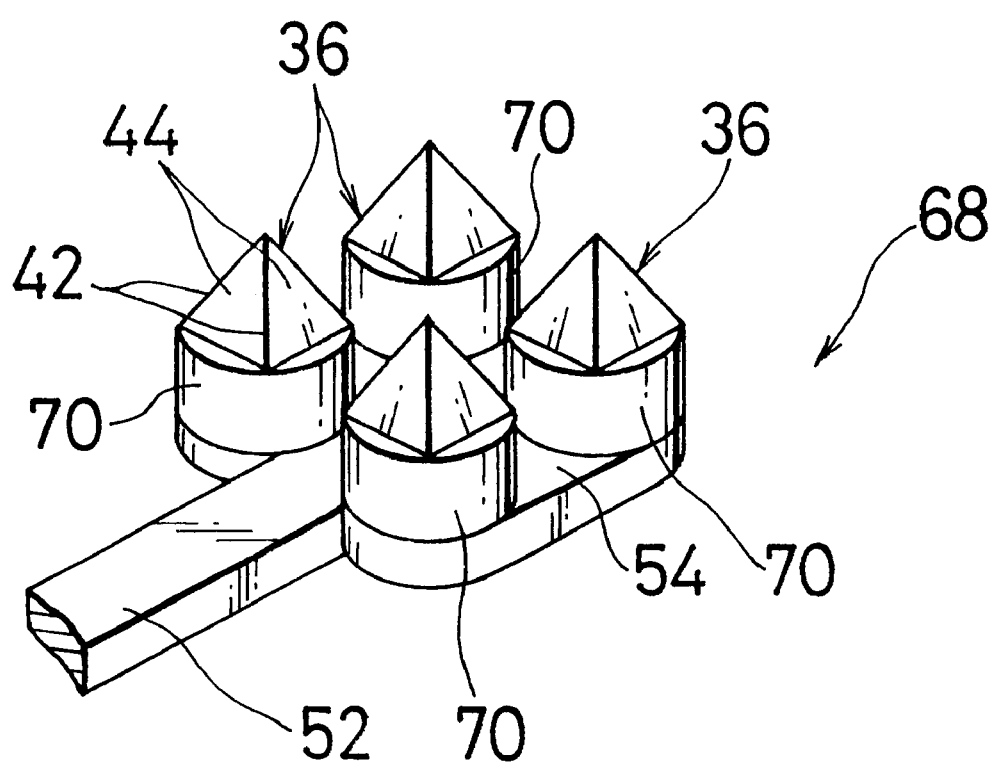

FIG. 8 is a diagram showing a sixth embodiment of the probe element.

Figure 9:
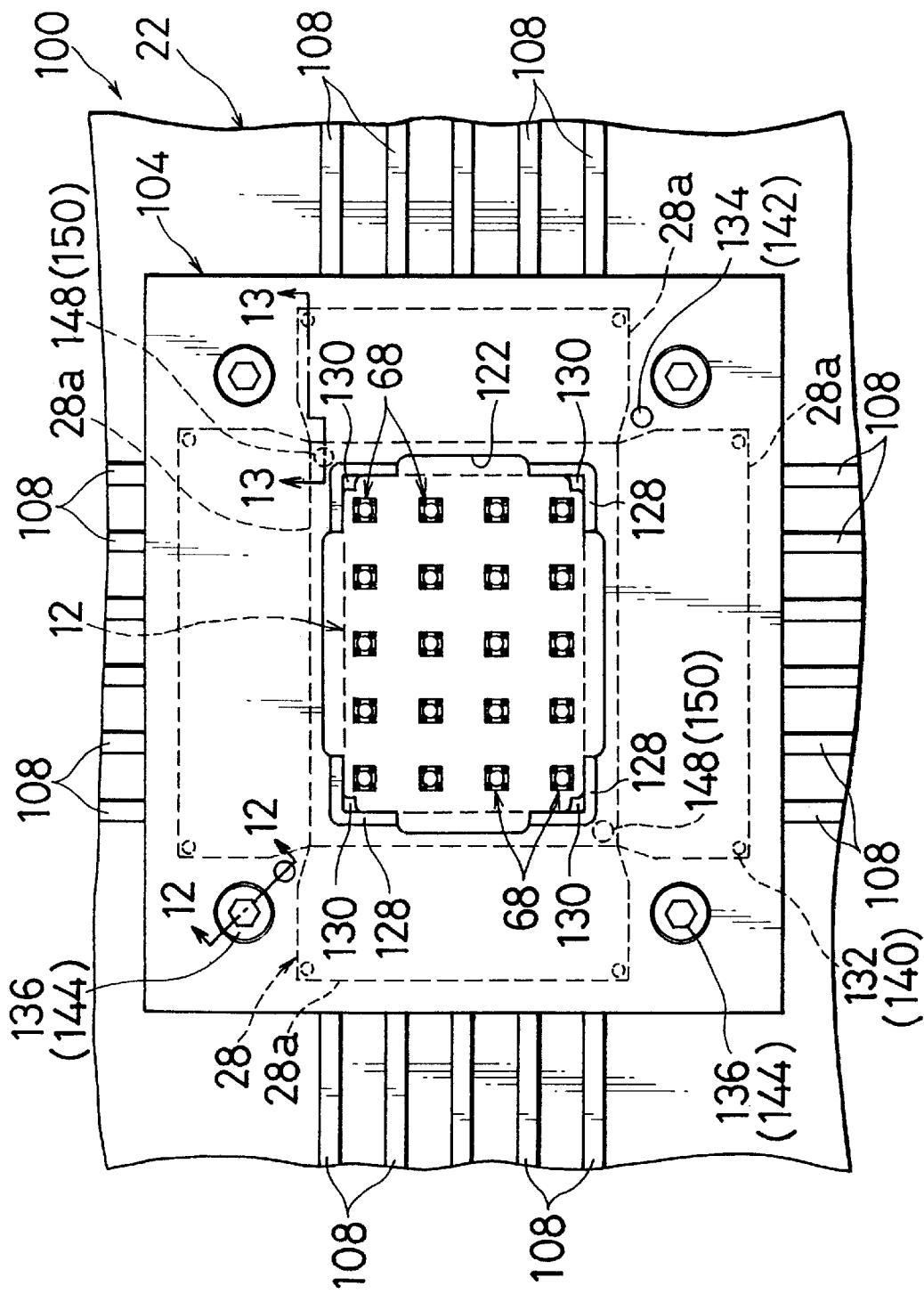

FIG. 9 is a plan view showing a second embodiment of the electrical contact apparatus according to the invention.

Figure 10:
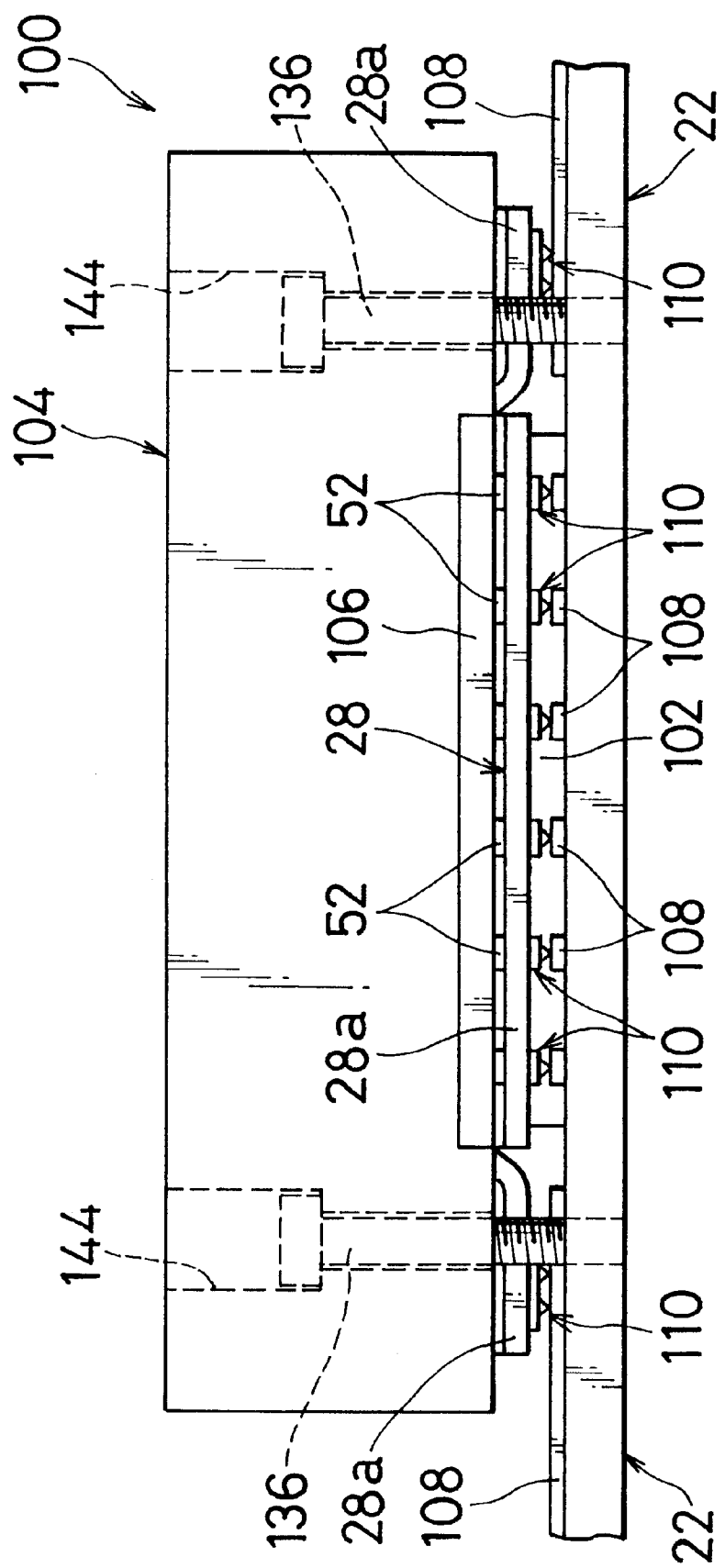

FIG. 10 is a front view of the electrical contact apparatus as shown in FIG. 9.

Figure 11:
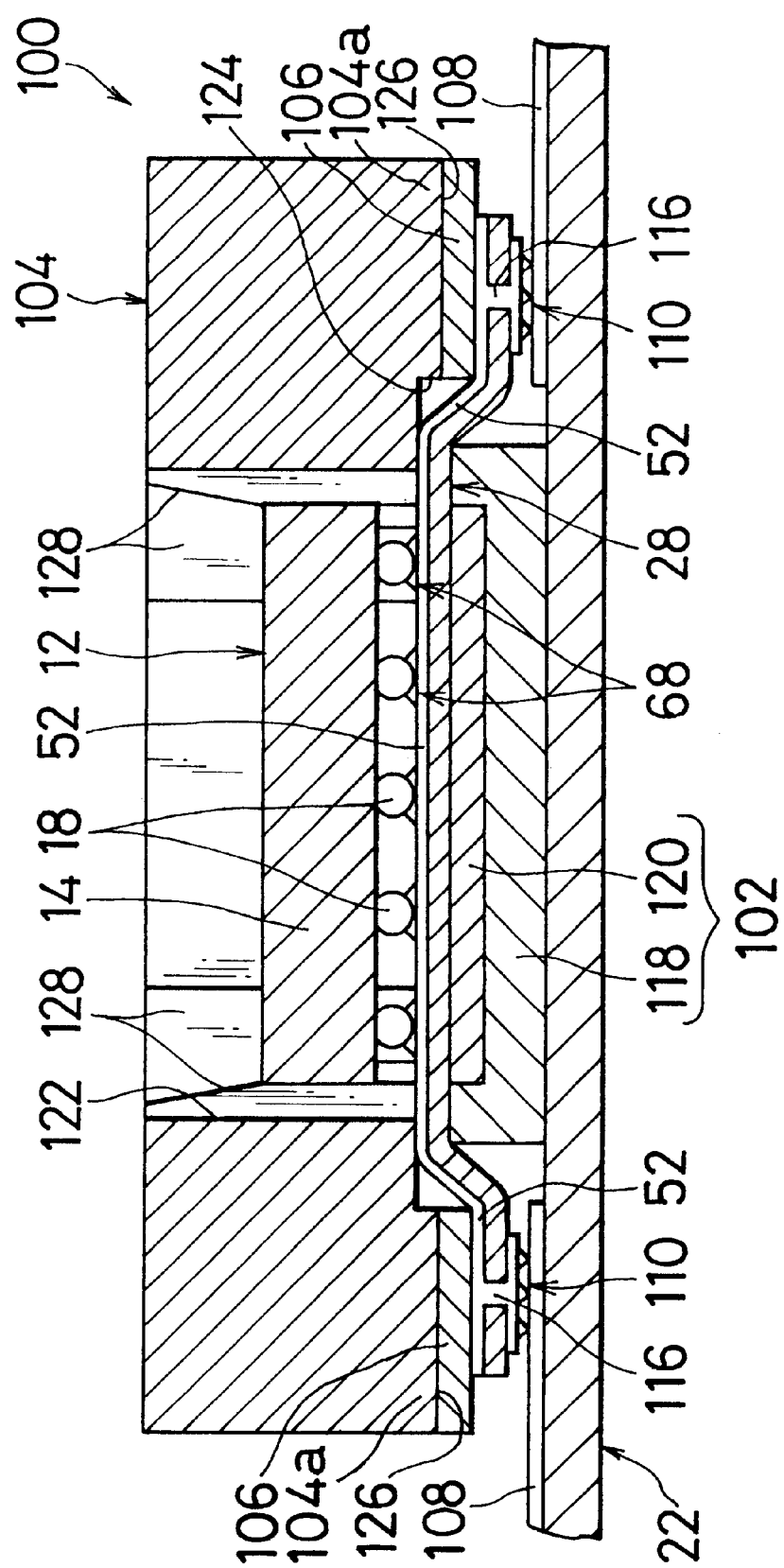

FIG. 11 is a cross-sectional view of the electrical contact apparatus as shown in FIG. 9.

Figure 12:
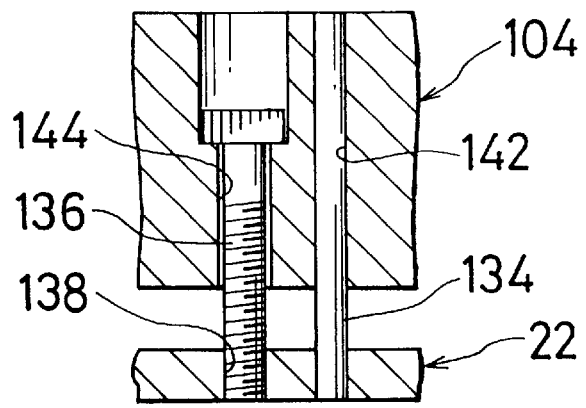

FIG. 12 is a cross-sectional view taken along a line 12—12 of FIG. 9.

Figure 13:
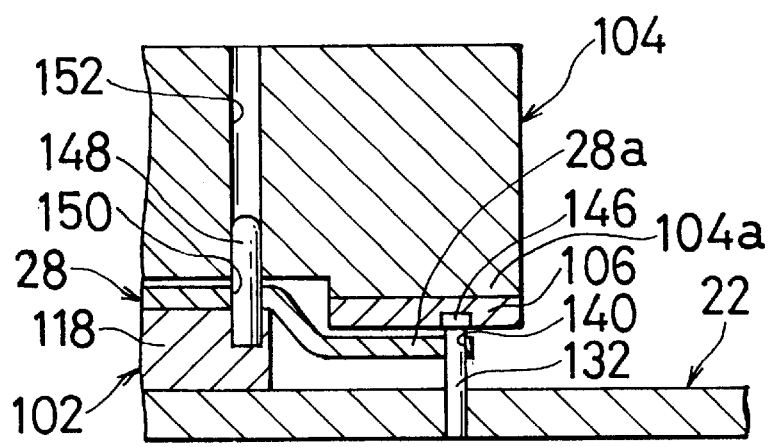

FIG. 13 is a cross-sectional view taken along a line 13—13 of FIG. 9.

Figure 14:
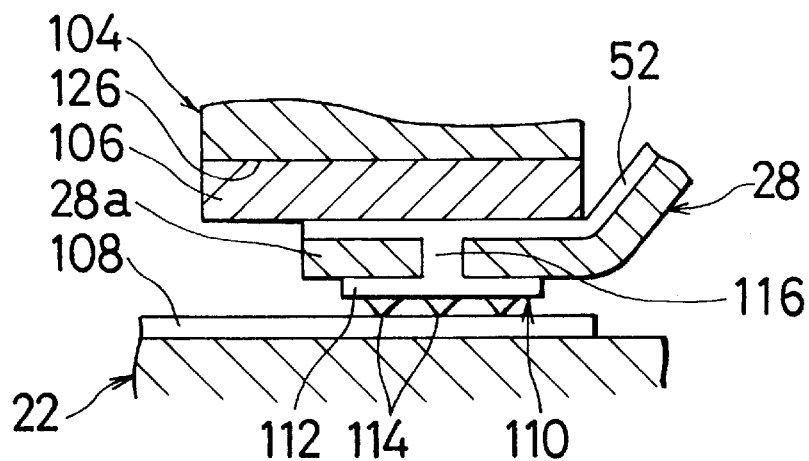

FIG. 14 is an enlarged cross-sectional view showing the vicinity of an auxiliary contactor in the electrical contactor apparatus shown in FIG. 9.

Figure 15:
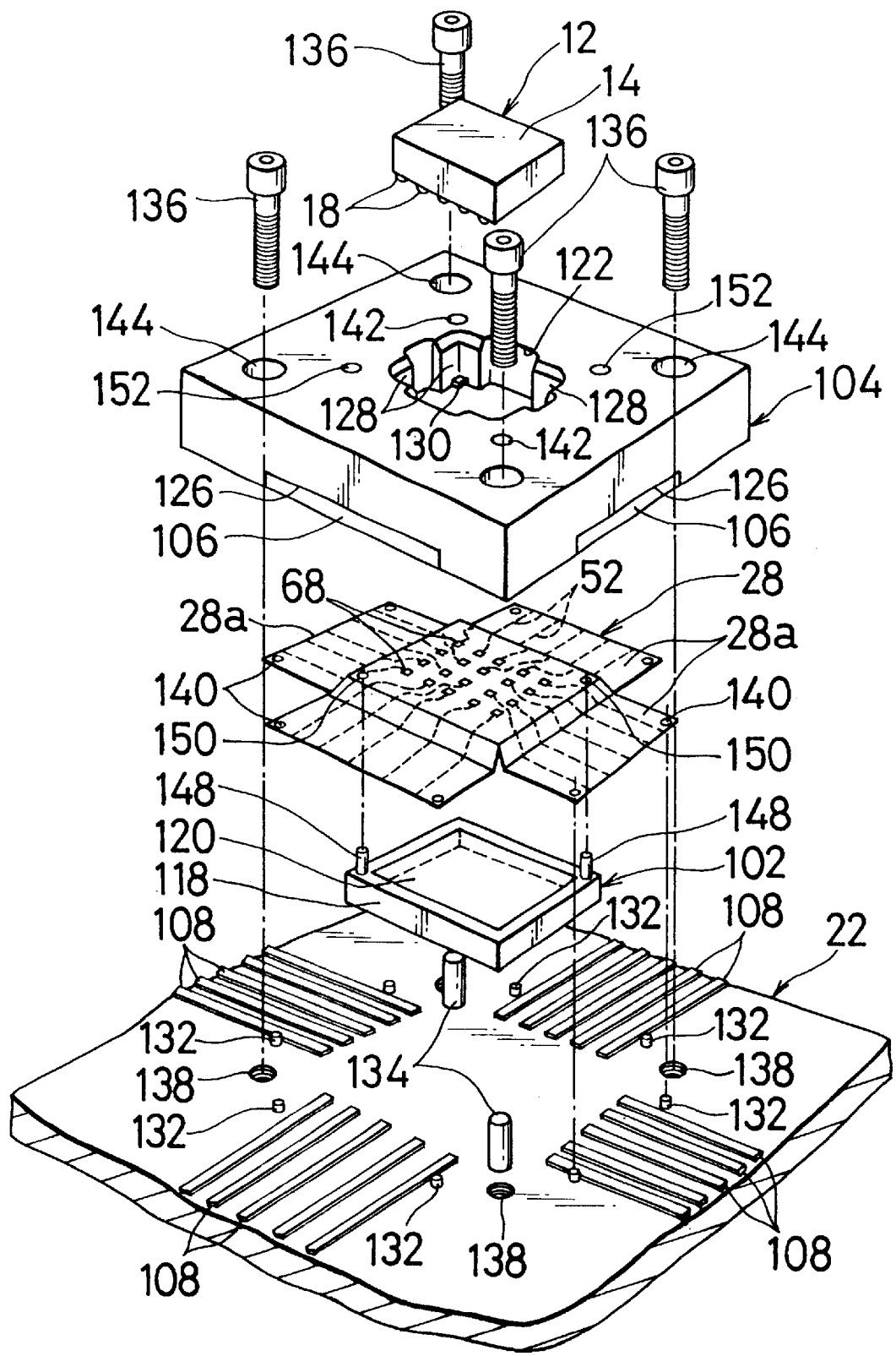

FIG. 15 is an exploded perspective view of the electrical contactor apparatus shown in FIG. 9.

Figure 16:
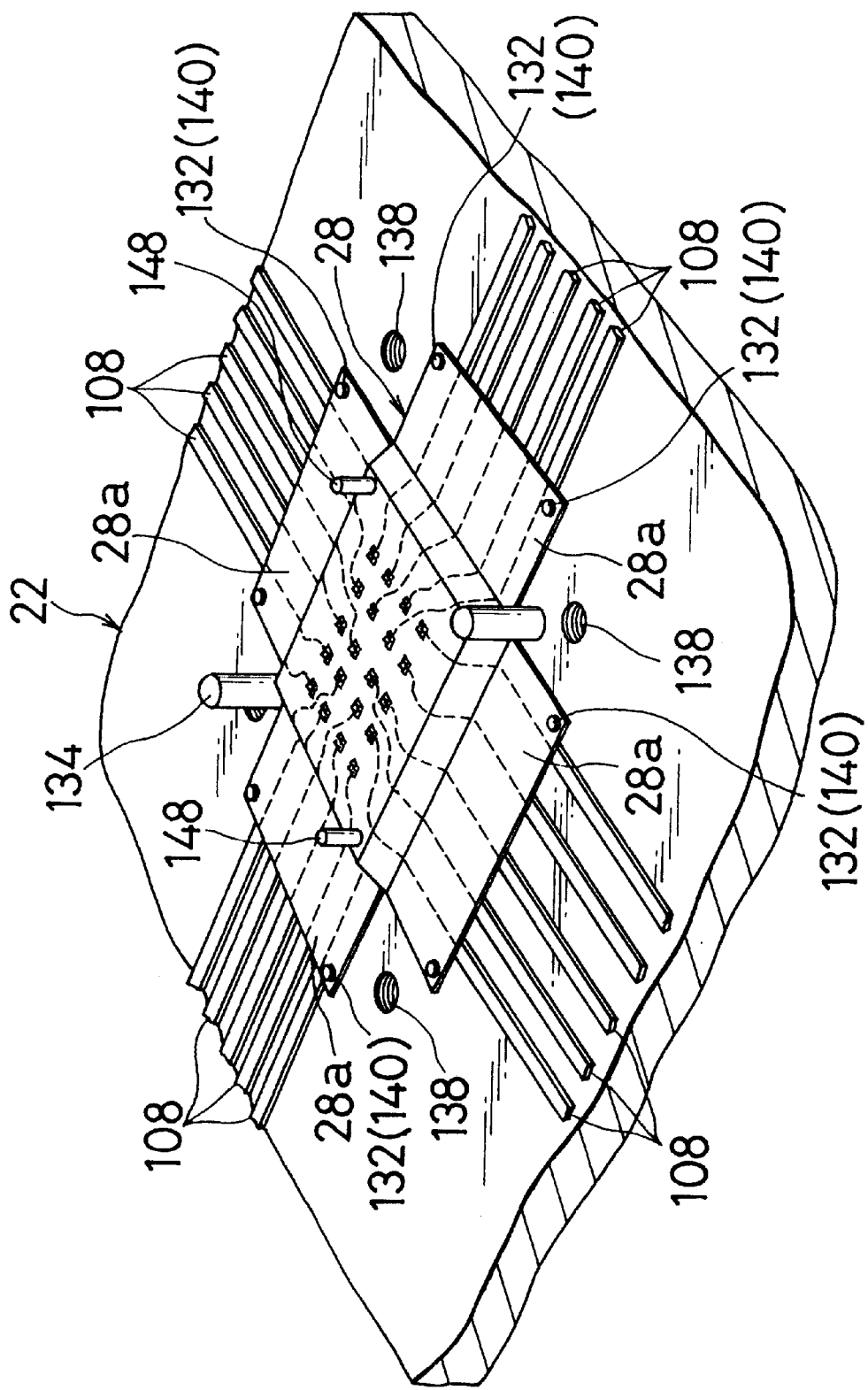

FIG. 16 is a perspective view showing the state where a base and a spacer are put together on a base plate of the electrical contactor apparatus shown in FIG. 9.

Figure 17:
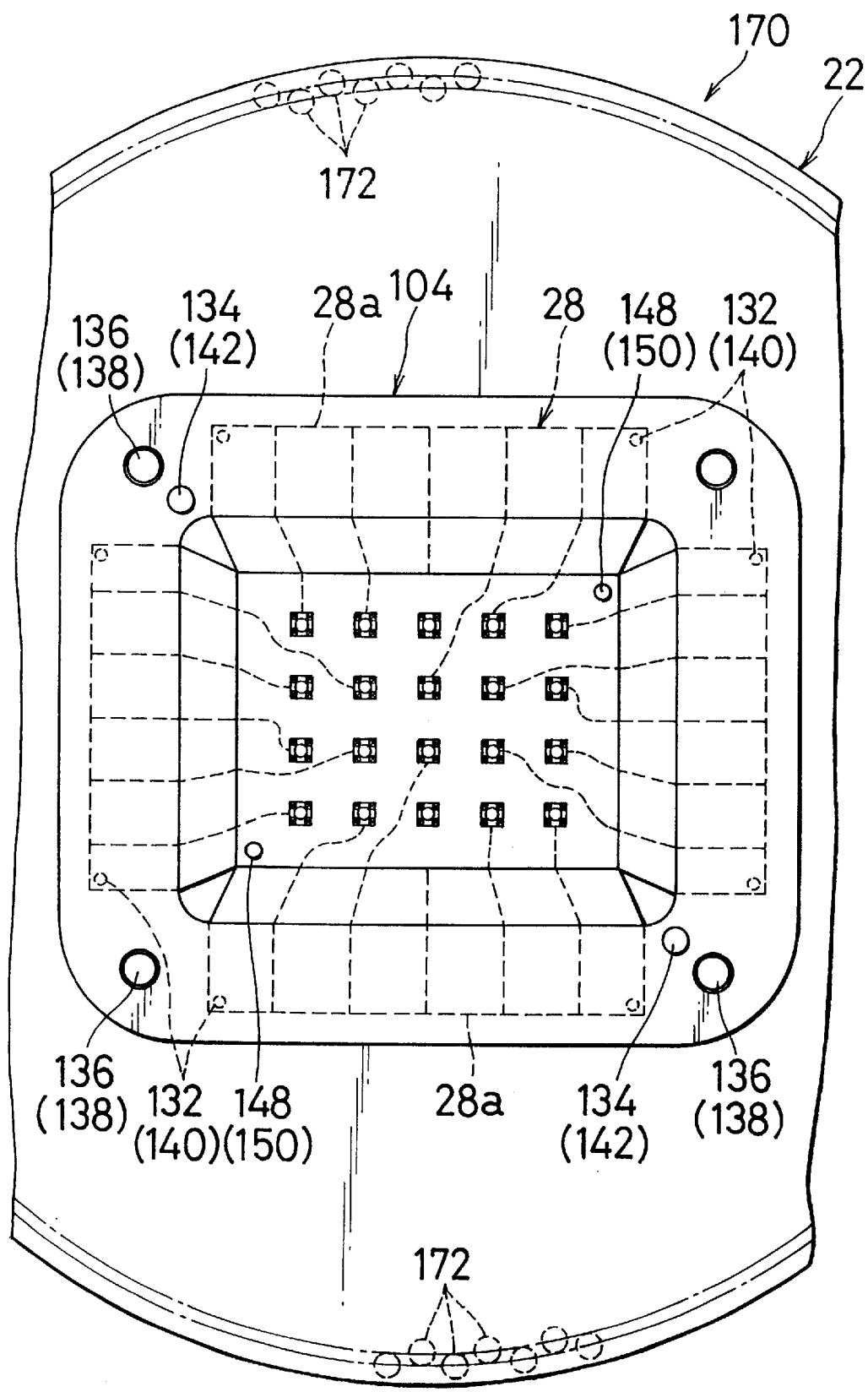

FIG. 17 is a plan view showing a third embodiment of an electrical contact apparatus according to the invention.

Figure 18:
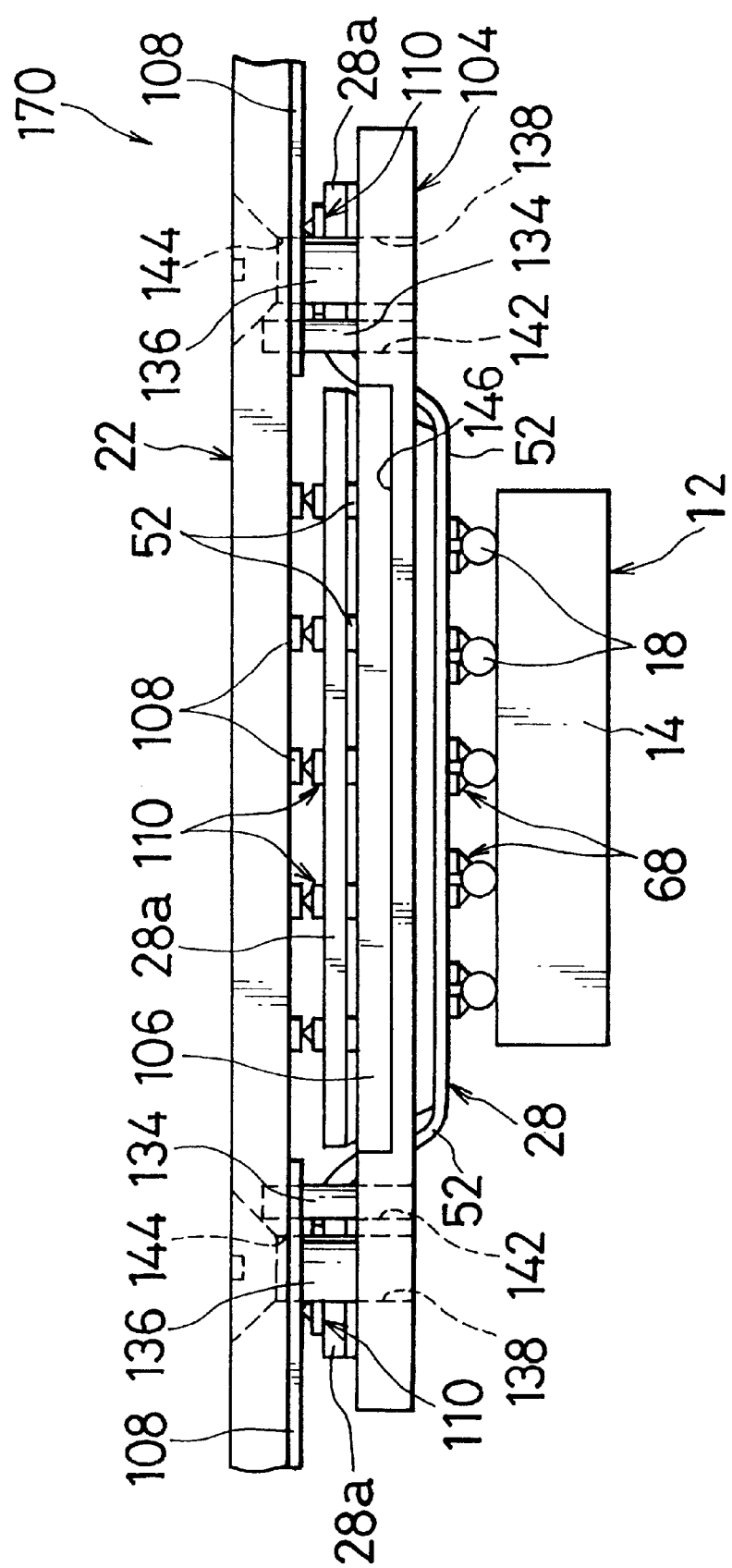

FIG. 18 is a front view of the electrical contact apparatus as shown in FIG. 17.

Figure 19:
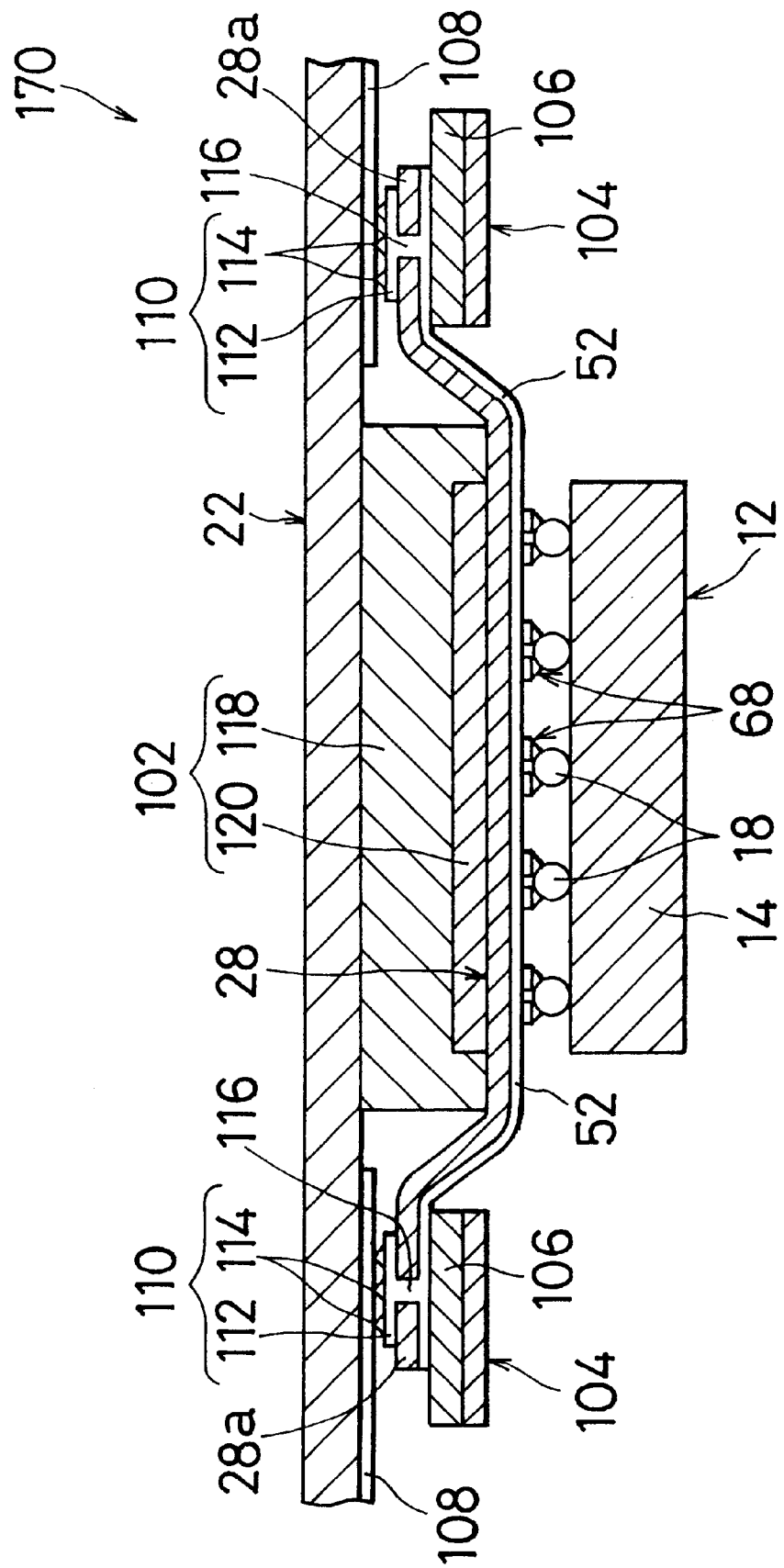

FIG. 19 is a cross-sectional of the electrical contact apparatus as shown in FIG. 17.

Figure 20:
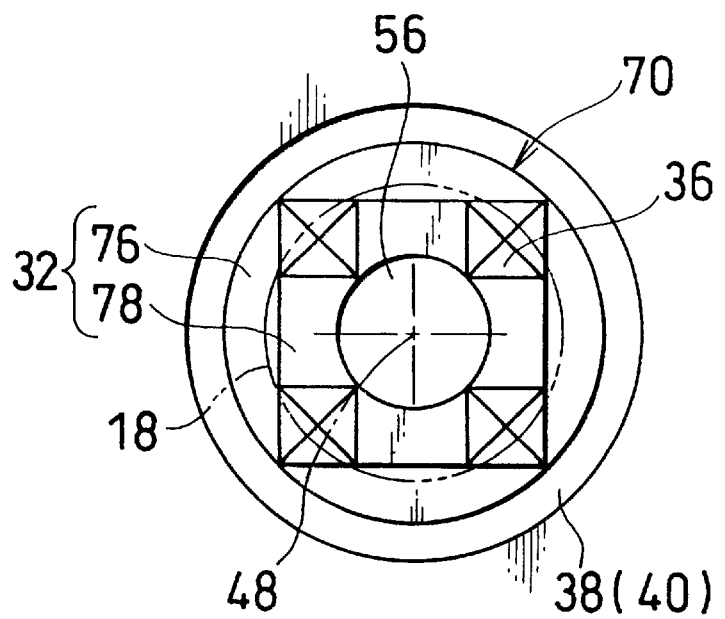

FIG. 20 is a diagram showing a seventh embodiment of the probe element.

Figure 21:
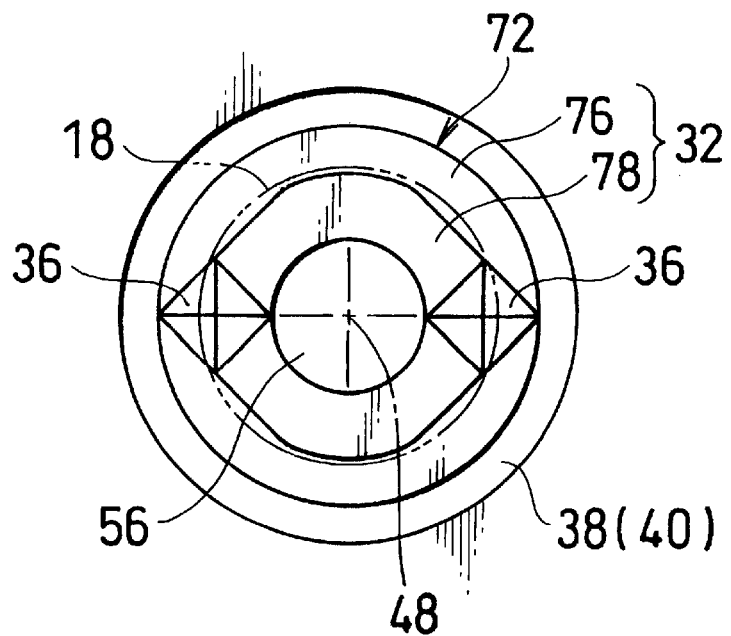

FIG. 21 is a diagram showing an eighth embodiment of the probe element.

Figure 22:
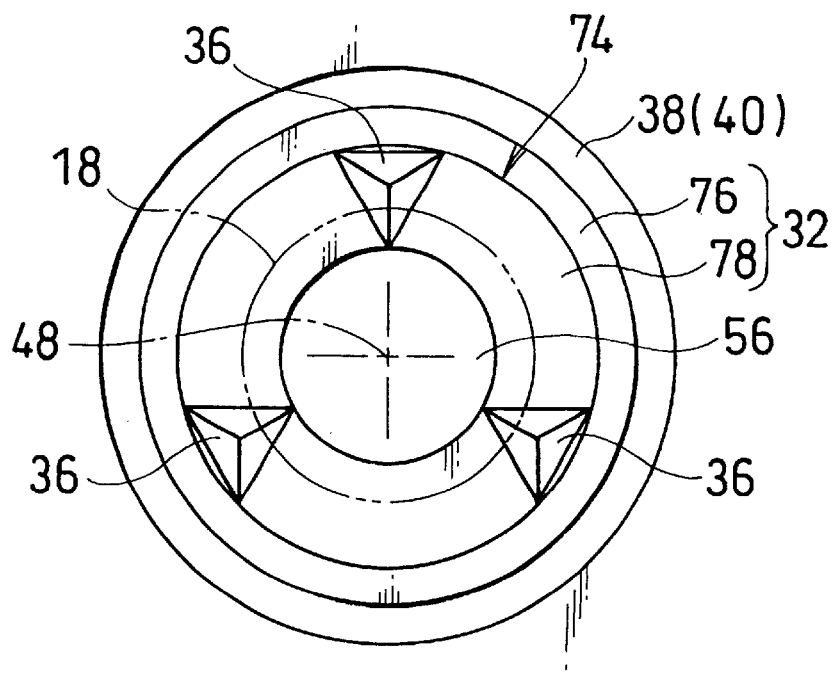

FIG. 22 is a diagram showing a ninth embodiment of the probe element.

Figure 23:
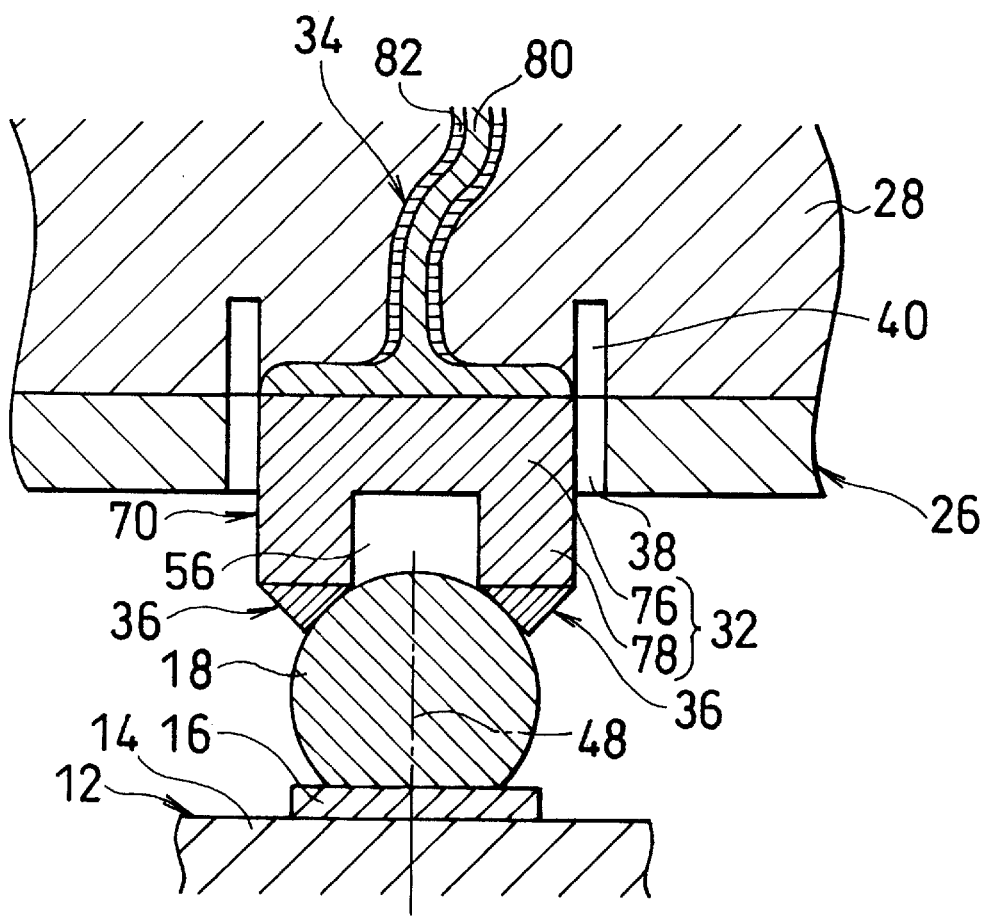

FIG. 23 is a cross-sectional view of the principal part of probe elements as indicated in FIGS. 20, 21, and 22.

PREFERRED EMBODIMENTS OF THE INVENTION

Figure 1:
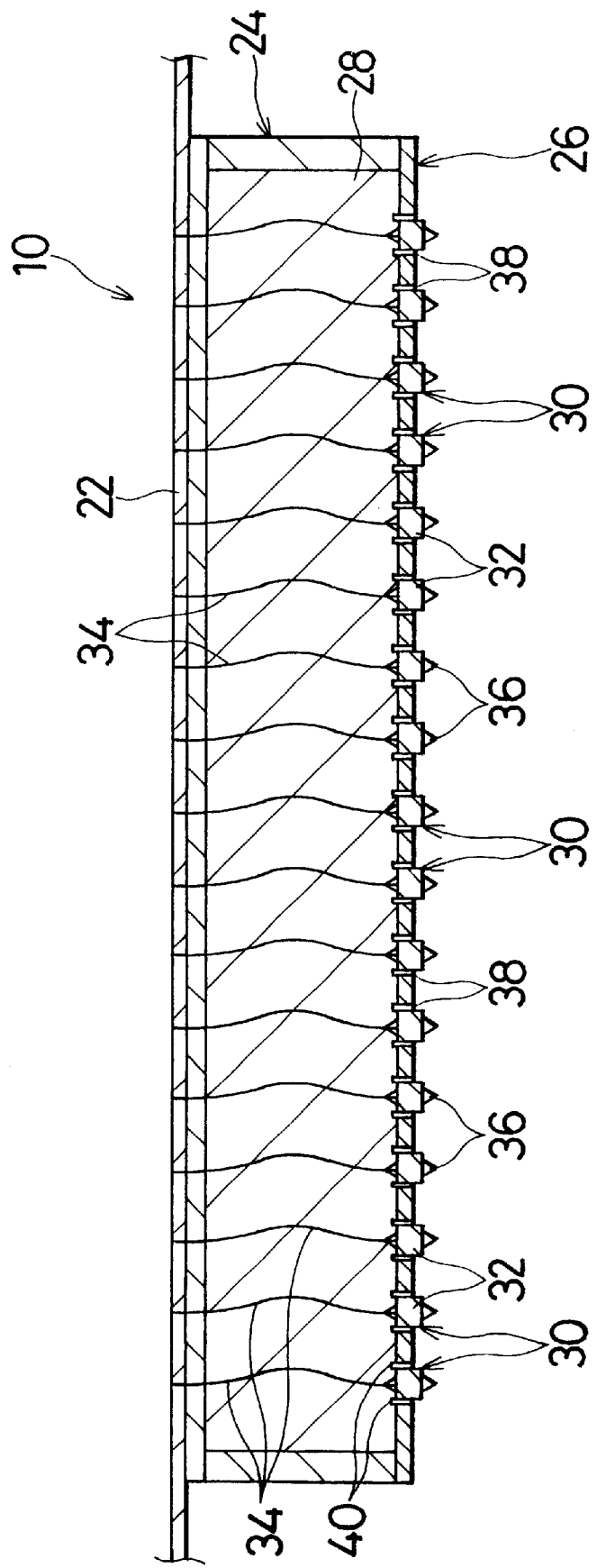

Referring to FIGS. 1 and 2, an electrical contact apparatus 10 is applicable to a probe card of the vertical type which uses a probe element of the wire type, for use in the electrical test (inspection) of a semiconductor device 12. The semiconductor device 12 is a flat plate-like object to be tested (referred to as "test-object" hereinafter) such as an IC chip, and has a plurality of electrode lands 16 on a flat plate-like base portion 14, and there is further formed on each electrode land 16 a hemispherical projection electrode 18. Each projection electrode 18 is made of a conductive adhesive having a low melting point like solder, for instance.

The electrical contact apparatus 10 includes a circular or rectangular base plate 22, a case 24 arranged on the lower surface of the base plate 22, a plate-like or filmy base 26 arranged at the lower end of the case 24, a rubber-like elastic body 28 filling up the inside of the case 24, and a plurality of probe elements 30 which penetrate the case 24, the base 26, and the elastic body 28 in the thickness direction of the base plate 22 and extend up to the base plate 22.

The base plate 22 is a connection base plate in which a plurality of wiring portions individually corresponding to each of the probe elements 30 are formed on an insulating sheet- or plate-like member in a single layer or multi-layers. The case 24 is made of an insulating material such as a synthetic resin in the form of a shallow box directing its one open side downward. The case 24 (i.e., the box) is fitted to the base plate 22 through a portion corresponding to the bottom thereof (shown as an upper wall in the figure). The case 24 has a flat circular or rectangular shape opening downward.

In an example as illustrated, the base 26 is a filmy layer made of an insulating material such as polyamide and is fitted to the open end of the case 24 so as to close it. The elastic body 28 is made of an insulating material such as silicone rubber. The probe elements 30 are formed such that they individually correspond to each of the electrodes of the semiconductor device to be tested and are arranged to have a layout pattern corresponding to the electrode layout pattern of the semiconductor device.

Each probe element 30 corresponds to each projection electrode 18. Each probe element 30 is provided with a seat portion (land portion) 32 penetrating the base 26 in the thickness direction thereof, a lead portion (wiring) 34 extending from the seat portion 32 such that it penetrates the elastic body 28 and the bottom of the case 24 as well in the thickness direction (upward and downward direction) of the base plate 22 and extends up to the base plate 22, and a pyramid-shaped contactor 36 projecting from the seat portion 32 toward the opposite side (downside) of the lead portion 34.

The seat portion 32 is made of a conductive material and has a proper shape such as a circular plate. This seat portion 32 is completely separated from the base 26 and isolated from adjacent seat portions 32 by means of an annular slit 38 formed in the base 26, the slit 38 standing around the seat portion 32 and penetrating the base 26 in the direction of the thickness thereof. In addition, another slit 40 leading to the slit 38 is formed in the elastic body 28.

The wiring, that is, the lead portion 34 may be made of a soft conductive metal such as gold. The lead portion 34 is bent to make a curve in the form of an arc inside the case 24. However, the lead portion 34 may be bent in another proper shape, or may remain straight without being bent. In any event, the seat portion 32 is maintained in parallel with the base 26.

The lead portion 34 as described above can be formed by means of what we call the wire bonding technique as used in the step of connecting a lead in the manufacturing process of the semiconductor device. The upper end of the lead portion 34 is electrically connected with the corresponding wiring arranged on the base plate 22. The lead portion 34 may be fixed to the bottom portion (upper wall) of the case 24 by a suitable means such as an adhesive.

Figure 2A:
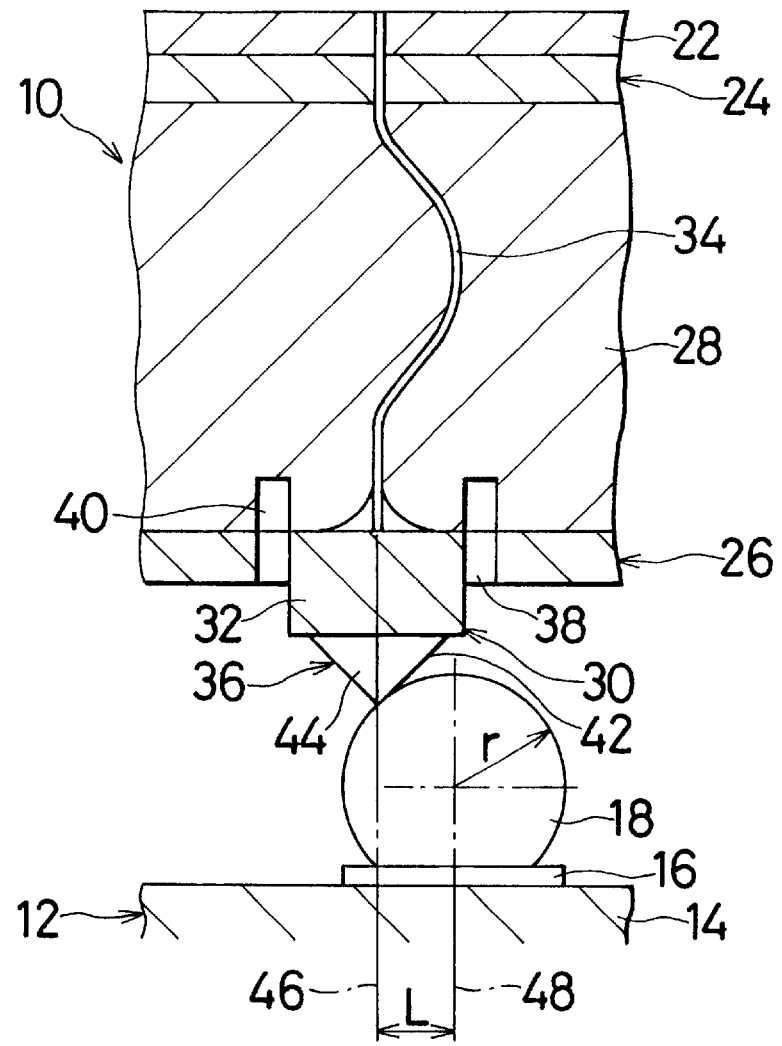
Figure 2B:
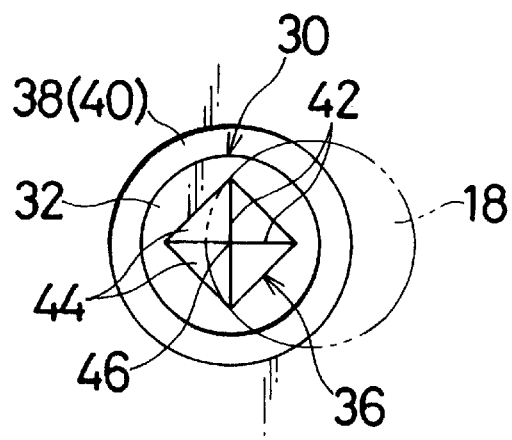

According to the example as shown in FIGS. 2A and 2B, each contactor 36 has a quadrilateral pyramid shape, so that it has a quadrilateral bottom surface, four edge lines 42, and four slant surfaces 44. Each contactor 36 is fitted to the seat portion 32 through the bottom surface of the pyramid so that the contactor 36 comes to project or stand up from the seat portion 32 toward the semiconductor device 12.

Each probe element 30 is formed in such a position as allows the contactor 36 to make a displacement with respect to the corresponding projection electrode 18, in one direction in a plane parallel to the base 26. For this reason, the center axis 46 of each contactor 36 is displaced from the center axis 48 of the corresponding projection electrode 18 by a distance of L, which is the same as or less than the curvature r of the circumferential surface of the projection electrode 18 (i.e., a half of the maximum outer diameter of the projection electrode 18 in the direction in parallel with the base 26). Each contactor 36 is arranged such that one edge line 42 thereof is directed toward the center axis 48 of the projection electrode 18.

The electrical contact apparatus 10 is assembled into a probe card by fitting the base plate 22 to a card base plate functioning as a base plate, for instance. In the electrical contact apparatus 10, the contactor 36 of the probe element 30 is used as a contact portion which is pressed on the projection electrode 18 of the semiconductor device 12 to be inspected.

At the time of the electrical test of the semiconductor device 12, the electrical contact apparatus 10 and the semiconductor device 12 are relatively moved such that the contactor 36 of each probe element 30 is pressed on the corresponding projection electrode 18. With this, as shown in FIGS. 2A and 2B, each contactor 36 is brought into contact with the outer circumferential surface of the projection electrode 18 through the edge line 42 and the vicinity thereof directing to the center axis 48 and is pressed on the outer circumferential surface.

At this time, since the edge line 42 of the contactor 36 makes an angle with respect to the center axis 48 of the projection electrode 18 on the side of the semiconductor device 12, the edge line 42 is not pressed on the tip portion of the projection electrode 18, and it just comes in contact with the side portion of the tip circumference and pushes that portion with an angle kept with respect to the center axis 48 as it is. Therefore, the projection electrode 18 is prevented from receiving any damage due to the pressure applied thereto by the contactor 36.

According to the electrical contact apparatus 10, since the seat portion 32 penetrates the filmy base 26 in the thickness direction thereof, there is neither fear that the seat portion 32 is moved excessively with respect to the base 26, nor fear that the contactor 36 excessively changes its position with respect to the semiconductor device 12, thus the positional relation between the semiconductor device 12 and the contactor 36 being stabilized. Furthermore, since the seat portion 32 projects downward to pass through the base 26, if the contactor 36 is pressed on the projection electrode 18 and the seat portion 32 is displaced a little to the side of the case 24, there is no fear that there happens the direct contact between the base 26 and the projection electrode 18.

When the contactor 36 is pressed on the projection electrode 18, the probe element 30 is displaced such that the seat portion 32 obliquely moves to the side of the case 24. At this time, since the seat portion 32 is isolated from the base 26 and adjacent seat portions 32 as well by the slit 38 extending around the seat portion 32, there is only a little chance that the mutual interference between the adjacent probe elements 30 is caused by their displacement with respect to the base 26.

If the contactor 36 is pressed on the projection electrode 18, the elastic body 28 is compressed by the seat portion 32, thus increasing the stylus pressure acting between the contactor 36 and the projection electrode 18. At this time, the lead portion 34 is deformed inside the case 24, but the excessive deformation of the lead portion 34 is prevented by the elastic body 28. Consequently, the contactor 36 can take a more stabilized position with respect to the semiconductor device 12 and the base 26 as well.

In the embodiment as described above, the seat portion 32 is completely isolated from the base 26 by means of the annular slit 38. However, it is possible to make the slit 38 C-shaped, thereby bringing a part around the seat portion 32 into contact with the base 26. Furthermore, as the case may be, the seat portion 32 need not be separated from the base 26, by not forming the slit 38.

It is not always necessary to form the slit 40 leading to the slit 38 in the elastic body 28. However, if the annular-type or C-shaped slit 40 is formed in the elastic body 28, the seat portion 32 and the portion of the elastic body 38 in contact therewith are isolated from each other, so that the mutual interference between the adjacent probe elements 30 is remarkably decreased by their displacement with respect to the base 26.

In the embodiment as described above, one contactor 36 is provided to correspond to each projection electrode 18. However, it is possible to provide a plurality of contactors 36 to correspond to a single projection electrode 18.

Figure 3A:
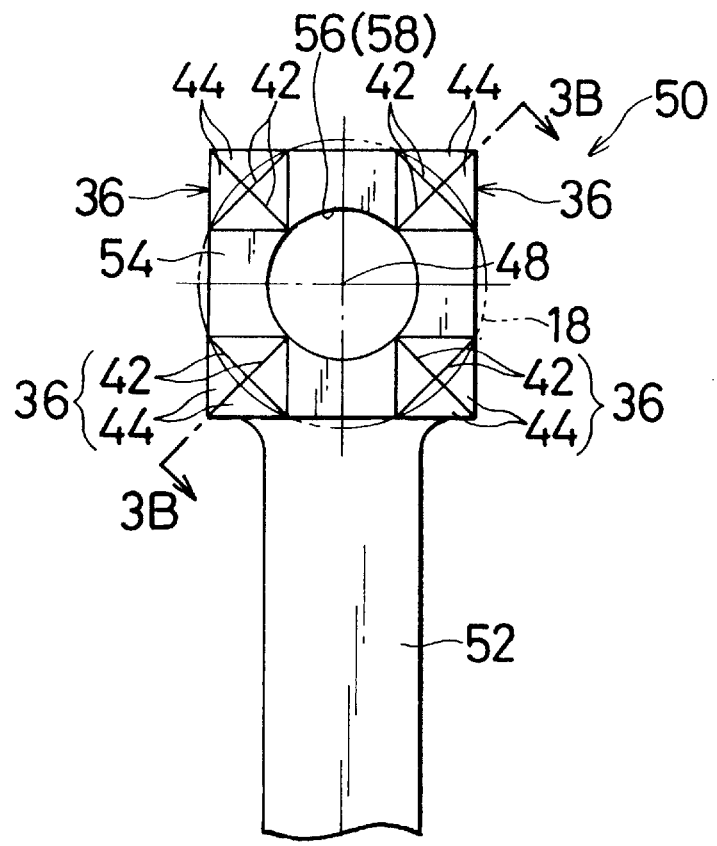
Figure 3B:
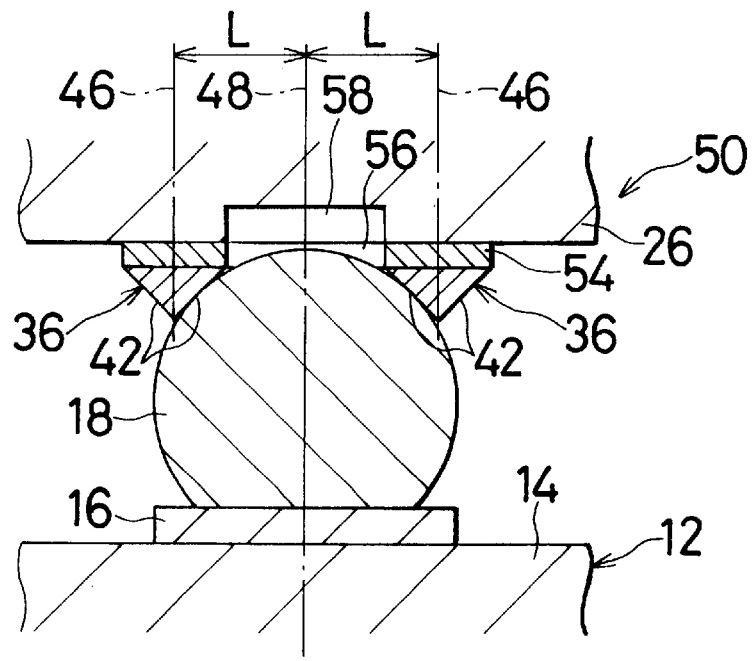

Referring to FIGS. 3A and 3B, a probe element 50 is a probe element of the strip-shaped wiring type. The probe element 50 includes a strip-shaped wiring 52 on behalf of the lead portion 34 acting as a wiring portion in the embodiment described above, a seat portion (land portion) 54 leading to one end of the wiring 52, and a plate-like (or filmy) base 26 made of an insulating material, on one surface of which the wiring 52 and the seat portion 54 are arranged. The probe element 50 makes use of four contactors provided for one projection electrode 18 and arranged on the seat portion 54 at equal angular intervals with respect to the center axis 48 of the corresponding projection electrode 18.

Each of four contactors 36 has a polygonal pyramid shape and is fitted to the seat portion 54 through the bottom surface of the pyramid so that the contactor 36 comes to project from the seat portion 54 toward the semiconductor device 12. Each contactor 36 directs its one edge line 42 to the center axis 48 of the projection electrode 18. The seat portion 54 may be formed in a suitable shape such as a rectangle.

The seat portion 54 and the base 26 are respectively provided with openings 56 and 58, which are opened toward the corresponding projection electrode and located inside an arrangement area defined by a plurality of contactors 36 as arranged there. These openings 56 and 58 act as a space into which the tip portion of the projection electrode 18 may run when the contactor 36 is pressed thereon.

Figure 4A:
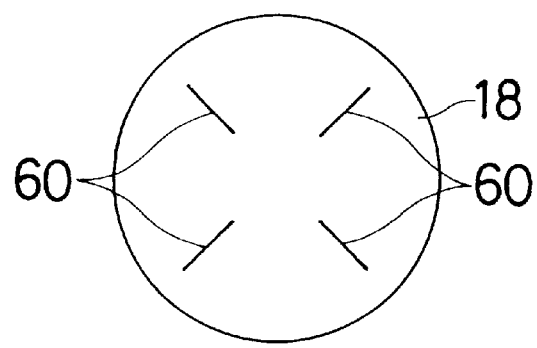

At the time of the electrical test using the probe element 50, one edge line 42 of each contactor 30 is pressed on the projection electrode 18. At this time, if each contactor 36 is correctly pressed on the projection electrode 18, four contact marks 60 as indicated in FIG. 4A are left on the surface of the projection electrode 18 due to the pressure the edge line of each contactor 36 applies thereto. Furthermore, when the contactor 36 is pressed on the projection electrode 18, since the tip portion of the projection electrode 18 can run into the openings 56 and 58, it collides with neither the base 26 nor the seat portion 54, thus preventing the tip portion of the projection electrode 18 from receiving any damage due to such collision.

Figure 4B:
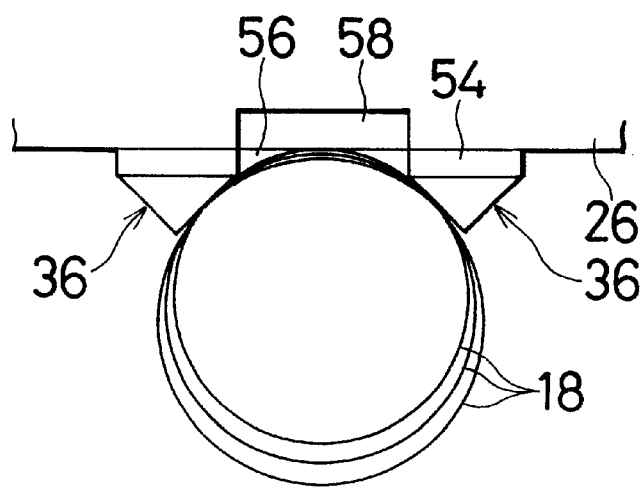
Figure 4C:
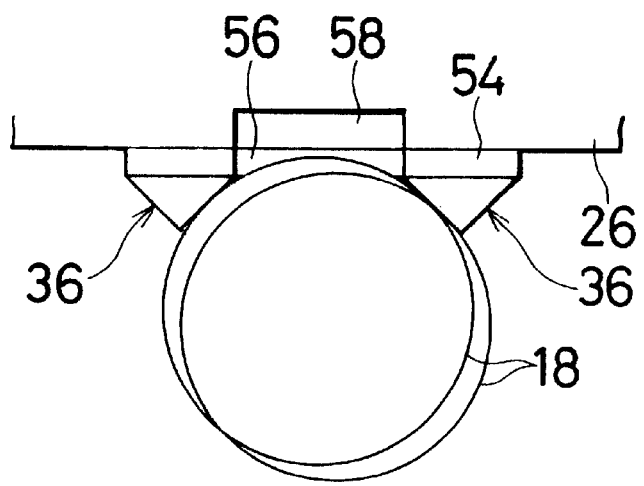

As shown in FIG. 4B, the probe element 50, having a plurality of pyramid-shaped contactors 36 arranged about the center axis 48 of a corresponding projection electrode 18 at equal angular intervals, can surely come in contact with the projection electrode 18 regardless of the size of the projection electrode 18. Furthermore, as illustrated in FIG. 4C, even if the relative positional relation of the projection electrode 18 and the contactor 36 in a plane parallel to the semiconductor device 18, is different a little from the predetermined one, some of contactors 36 never fails to come in contact with the projection electrode 18.

Figure 5:
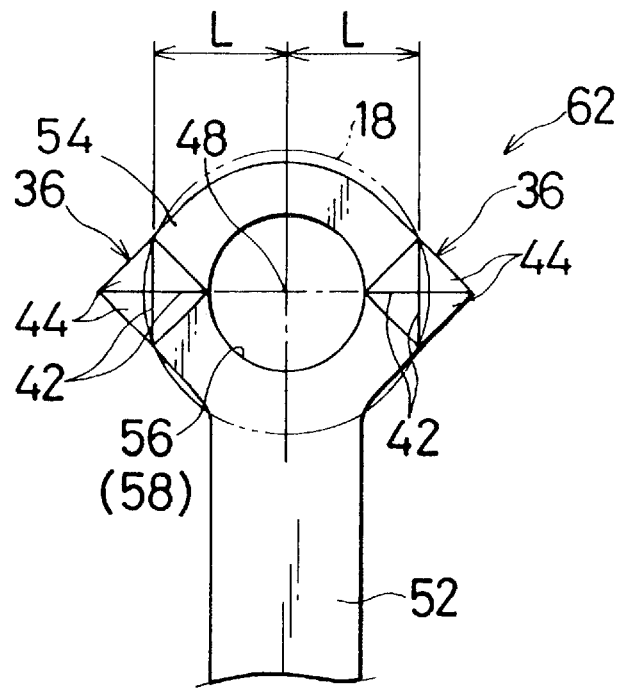
FIG. 5 is a diagram showing a third embodiment of the probe element.
Figure 6:
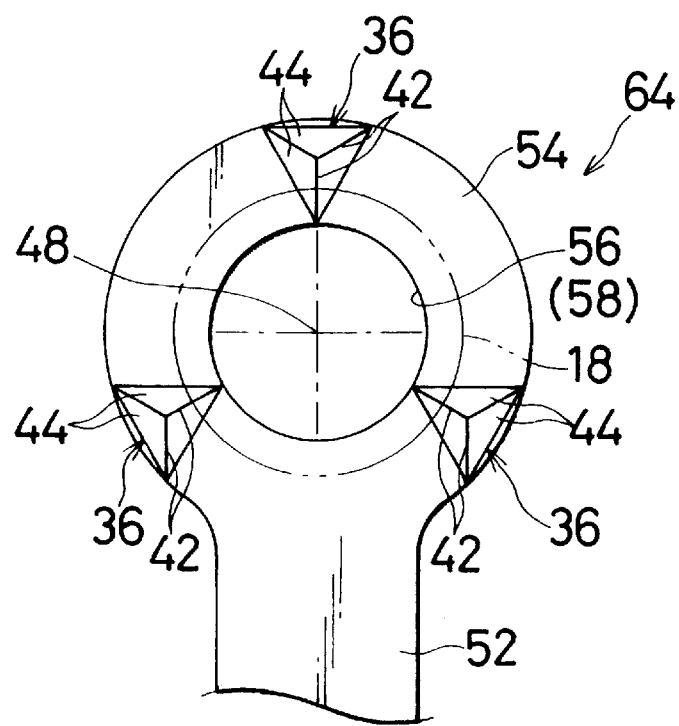
FIG. 6 is a diagram showing a fourth embodiment of the probe element.

The function and effect as described above can be also attained by using a probe element 62 provided with two pyramid-shaped contactors 36 as shown in FIG. 5, and also attained by using a probe element 64 provided with three triangular (three-faced) pyramid-shaped contactors 36 as shown in FIG. 6. In short, the function and effect as described above can be attained whenever there is used a probe element provided with a plurality of pyramid-shaped contactors 36 which are arranged around the center axis of the projection electrode 18 at angular intervals (preferably, at equal angular intervals).

Furthermore, similar to the case of using the probe element 64 provided with one or more contactors 36 in the shape of the three-faced pyramid as illustrated in FIG. 6, the function and effect as described above can be obtained by using one or more contactors 36 having a shape of a polygonal pyramid other than the quadrilateral pyramid, for instance, a three-faced pyramid, a six-faced pyramid, and an eight-faced pyramid and so forth.

Still further, like the case of the probe element 66 as shown in FIGS. 7A and 7B, one or more pyramid-shaped contactors 36 are arranged such that one of its slant surfaces 44 of each contactor 36 is directed to the center axis 48 of the projection electrode 18 and comes in contact with the projection electrode 18 when pressing the probe element 66 on the projection electrode 18. With this arrangement of the contactors 36, the function and effect as described above can be attained.

Like the case of a probe element 68 as indicated in FIG. 8, the projection height of each contactor 36 from the seat portion 54 may be increased by providing an auxiliary seat 70 for each contactor 36. The shape of the auxiliary seat 70 may be different from or identical to the bottom shape of the contactor 36. Furthermore, two or more contactors 36 may be mounted on one auxiliary seat 70.

In probe elements 50, 62, 64, and 66, similar to the probe element 30 as shown in FIGS. 1, 2A, and 2B, slits 38 and 40 may be formed around each contactor 36 or around an area in which a plurality of contactor 36 are arranged so as to correspond to a common projection electrode 18. In any of the probe elements, the seat portion may have various shapes such as a triangular shape, a hexagonal shape, and so forth, besides a circular shape, a square shape, and a rectangular shape.

Referring to FIGS. 9 through 16, an electrical contact apparatus 100 is assembled as an IC socket for use in the electrical test of a semiconductor device 12 such as an integrated circuit sealed with package or one unsealed with package.

The electrical contact apparatus 100 includes a circular or rectangular base plate 22, a filmy base 28 arranged approximately at the center portion of the base plate 22, a plurality of probe elements 68 formed on the base 28, a spacer 102 arranged between the base plate 22 and the base 28, a case or a frame 104 arranged on the upper side of the base plate 22, and a plurality of rubber plates arranged on the frame 104.

The base plate 22 is a wiring board having a plurality of wiring portions 108 on its upper surface, the wiring portions being electrically separated from each other. The wiring portions 108 have one-to-one correspondence to the projection electrodes of the semiconductor device 12 to be inspected, and are divided into four wiring groups extending in the four different directions from the arrangement area where the base 28 is arranged.

The base 28 has a plurality of probe elements 68 as shown in FIG. 8 on one surface thereof. The probe elements 68 are arranged at one end of each wiring portion 52 such that the pyramid shaped contactor 36 forming a part of the probe element 68 is positioned so as to form a matrix-like shape within a rectangular area approximately equal to the semiconductor device 12 in size.

The probe element 68 and the wiring 52 forming a part thereof correspond to the projection electrode 18 of the semiconductor 12. Similar to the wiring portions 108 of the base 22, the wiring portions 52 are divided into four groups extending in the four different directions from the arrangement area where the contactors 36 are arranged, and the wiring portions 52 have a one-to-one correspondence to the wiring portions 108. Another probe element may be used instead of the probe element 68.

The base 28 includes rectangular portions 28a extending outward from each side of the rectangular arrangement area in which the probe elements 68 are arranged in the matrix form, and each extended portion 28a also includes a plurality of auxiliary probe elements 110 having a one-to-one correspondence to each pair of the wiring 52 and the probe element 68. Each of auxiliary probe elements 110 is made up of a wiring 112 and one or more auxiliary contactors 114 formed on the wiring 112 and is positioned on the opposite side (lower surface) of the probe element 68 (see FIG. 14).

In the example as shown in the figure, those plural auxiliary contactors 114 are aligned on each wiring 112. Each auxiliary contactor 114 of this example as shown has a pyramid shape, and all the auxiliary contactor 114 arranged on the corresponding wiring 112 press together corresponding wiring portions 108 of the base plate 22 by their tip portions (apexes), respectively, thereby bringing them into electrical contact with the wiring portions 108.

If the wiring portions 108 of the base plate 22 are arranged to radially extend around the center of the base plate 22 at angular intervals, the wiring portions 112 of the auxiliary probe element 110 are also arranged to radially extend around the center of the base plate 22 at angular intervals.

Each wiring portion 112 is electrically connected with a corresponding wiring portion 52 through a conductive portion 116 penetrating the base 28 in the direction of the thickness thereof. With this arrangement, the auxiliary contactor 114 of each auxiliary probe element 110 is electrically connected with the pyramid-shaped contactor 36 of the corresponding probe element 68. The auxiliary contactor 114 may have various shapes, for instance a circular cone shape, a truncated pyramid shape, a truncated circular cone shape, and so forth.

The spacer 102 consists of a plate-like pedestal 118 and a plate-like elastic body 120 arranged on the pedestal 118 and has a rectangular plate-like shape as a whole. The pedestal 118 has a plane shape larger than that of the semiconductor device 12 to be inspected and includes a recess on its upper surface in which the elastic body 120 is arranged. The elastic body 120 is made of rubber and has a rectangular plane shape almost equal to that of the semiconductor device 12, and its upper surface and that of the pedestal 118 are almost on the same plane.

The frame 104 has a thick rectangular plate shape and includes, in its center portion, an opening 122 for receiving the semiconductor device 12 and a recess 124 (see FIG. 11) leading to the lower end of the opening 122. The frame 104 also includes a notched portion 126 around the recess 124, and a rubber plate 106 is arranged on the notched portion 126.

The opening 122 has an approximately rectangular plane shape and also includes, at each corner thereof, a guide surface 128 for guiding the semiconductor device 12. Each guide surface 128 is made up of an upper slant surface portion for guiding the semiconductor device 12 to the center of the opening 122, and a vertical surface portion leading to the lower end of the slant surface portion. The guide portion 128 also has a stopper 130 for receiving the semiconductor device 12 in the lower part thereof.

The recess 124 has a rectangular shape larger than that of the opening 122. The rubber plate 106 has a size almost equal to the lower surface of the projection portion 104a of the frame 104 (see FIGS. 11 and 13) and is adhered to the notched portion 126.

Furthermore, the base plate 22 includes a plurality of guide pins 132 for positioning the base 28 with respect to the base plate 22, a plurality of guide pins 134 for positioning the frame 104 with respect to the base plate 22, and a plurality of threaded holes 138 for receiving bolts for use in assembling work. These guide pins 132 and 134 stand upright from the base plate 22.

The base 28 has, at the extended part 28a thereof, a guide hole 140 for receiving each guide pin 132. The frame 104 has a guide hole 142 for receiving each guide pin 134 and a guide hole 144 which each bolt 136 penetrates. The rubber plate 106 has a recess (spot facing) 146 capable of receiving the upper portion (head) of each guide pin 132 (see FIG. 13).

The spacer 102 has a plurality of guide pins 148 for relatively positioning the base 28, the spacer 102, and the frame 104 on the pedestal 118. Each guide pin 148 projects upward from the pedestal 118 and penetrates the base 28 to be received in a part of the frame 104. The base 28 and the frame 104 have holes 150 and 152, respectively, for receiving the guide pin 148 (see FIG. 13).

The electrical contact apparatus 100 is assembled as follows.

In the first place, guide pins 148 are inserted in corresponding holes 150 of the base 28, respectively, whereby the relative position between the base 28 and the spacer 102 is determined. At this time, the base 28 is joined together with the spacer 28 such that the pyramid-shaped contactor 36 is placed on the upside while the auxiliary contactor is placed on the downside. With this arrangement, the base 28 and the spacer 102 are joined together such that the elastic body 120 is positioned in the center portion corresponding to the arrangement area of the probe element 68 and the extended portion 28a of the base 28 is positioned around the spacer 102.

Next, guide pins 132 are inserted in corresponding holes 140, respectively, thereby positioning the base 28 and the spacer 102 with respect to the base plate 22. With this, the base plate 22, the base 28, and the spacer 102 are put together as illustrated in FIG. 16, and each auxiliary contactor 114 of the base 28 comes in contact with the end portion of the corresponding wiring 108 of the base plate 22.

Furthermore, the frame 104 is arranged on the upside of the base 28 such that guide pins 134 and 148 are accepted in corresponding holes 142 and 152, respectively. With this, the position of the frame 104 is determined with respect to the base plate 22, the base 28, and the spacer 102.

Still further, bolts 136 are inserted in corresponding holes 144 of the frame 104 and screwed in corresponding threaded holes 138 of the base plate 22, whereby the electrical contact apparatus 100 as shown in FIGS. 9 through 11 is assembled.

In the assembled state, the pyramid-shaped contactor 36 projects inside the recess 124 of the frame 104. Also, the auxiliary contactor 114 is pressed on the corresponding wiring portion 108 of the base plate 22, thereby achieving a sure electrical connection with the corresponding wiring 108.

As described above, the assembling work of the electrical contact apparatus 100 can be carried out with ease because the positioning among related parts and members can be carried out by making use of just guide pins and holes corresponding thereto. Moreover, the base plate and the frame can be put together finally by means of a few bolts. Furthermore, the decomposition of the electrical contact apparatus 100 may be carried out also with ease by reversing the course of assembling it.

At the time of electrical test of the semiconductor device 12, the objective semiconductor device 12 is dropped from the upside of the electrical contact apparatus 100 into the opening 122 of the frame 104. With this, the semiconductor device 12 is first led to the center portion of the opening 122 along the slanting portion of the guide surface 128, and then moved down due to its own weight along the vertical portion of the guide surface 124.

After this, each projection electrode 18 of the semiconductor device 12 is pressed by the corresponding pyramid-shaped contactor 36. At this time, since the edge line (or slant surface) of the pyramid-shaped contactor 36 is at an angle with the center axis of the projection electrode 18 of the semiconductor device 12, the edge line (or slant surface) does not press the tip portion of the projection electrode 18 but comes in contact with the surrounding portion thereof, and presses this contact portion, keeping the above angle as it is. Accordingly, the projection electrode 18 is prevented from receiving any damage due to the pressure given by the pyramid-shaped contactor 36.

If the pyramid-shaped contactor 36 is pressed on the projection electrode 18, the elastic body 120 of the spacer 102 is compressed by each probe element 68, whereby the stylus pressure acting between the pyramid-shaped contactor 36 and the projection electrode 18 is increased.

Referring to FIGS. 17 through 19, an electrical contact apparatus 170 is assembled as a probe card for use in the electrical test of a general type semiconductor device 12, so that the apparatus 170 is used in such a state as the upward and downward directions of the apparatus 100 are reversed.

Similarly to the electrical contact apparatus 100, the electrical contact apparatus 170 includes a base plate 22, a filmy base 28 arranged approximately at the center portion of the base plate 22, a plurality of probe elements 68 formed on the base 28, a spacer 28 arranged between the base plate 22 and the base 28, a frame 104 arranged on the upside of the base plate, and a plurality of rubber plates 106 arranged on the frame 104.

The base plate 22 is the same as that of the electrical contact apparatus 100 except the leading to point. That is, this base plate 22 is a wiring board having a circular shape and has, on its upper surface, a plurality of wiring portions 108 electrically isolated from each other, and also has, in its peripheral portion, a plurality of tester lands 172 to be connected with the electrical test circuit of an inspection apparatus.

The base 28 is almost the same as the one used in the electrical contact apparatus 10. Accordingly, in the present embodiment, the base 28 has a plurality of probe elements 68, of which each is arranged at the one end of each wiring portion 52 forming a part of the probe element 68 such that the pyramid-shaped contactor 36 forming a part of the probe element 68 is positioned so as to form a matrix-like shape within a rectangular area approximately equal to the semiconductor device 12 in size. The base 28 includes rectangular portions 28a extending from each side of the rectangular area in which the probe elements 68 are arranged, and each extended portion 28a also includes a plurality of auxiliary probe elements 110 of which each corresponds to each pair of the wiring 52 and the probe element 68.

However, each auxiliary probe element 110 is different from the auxiliary probe element of the electrical contact apparatus 10 in that the former is formed on the lower surface of the base 28. Each auxiliary contactor 114 is pressed on the corresponding wiring portion 108 through its tip portion, thereby coming in electrical contact with the wiring portion 108, and is electrically connected with the corresponding wiring portion 52 through a conductive portion 116 penetrating the base 28 in the thickness direction thereof.

The spacer 102 is identical to the spacer of the electrical contact apparatus 100, so that the spacer 102 includes a pedestal 118 and a plate-like elastic body 120 and has a thick plate-like shape as a whole.

The frame 104 is formed in a rectangular frame shape by using plate members such that it is larger than the plane shape of the semiconductor device 12 to be inspected. Each rubber plate 106 is formed in a rectangular shape almost equal to the extended portion 28a of the base 28 in size and is arranged on the upper surface of a portion corresponding to each side of that rectangular shape.

Similarly to the electrical contact apparatus 100, in the electrical contact apparatus 170, the base plate 22 also has guide pins 132 and 134, the base 28 has guide holes 140 and 150, the frame 104 has guide holes 142, the rubber plate 106 has recesses 146, and the spacer 102 has guide pins 148.

However, in the electrical contact apparatus 170, since the bolts 136 for use in the assembly of the apparatus 170 is made to penetrate the base plate 22 and to screw to the frame 104, the threaded holes 138 are formed on the side of the frame while the guide holes 144 are formed on the base plate 22. Accordingly, the frame 104 has no guide hole for use in any guide pin 148. The length of the bolt 136 for use in assembly of the electrical contact apparatus 170 is made a little shorter than that which is used in the electrical contact apparatus 100.

The electrical contact apparatus 170 may be assembled and decomposed in the same way as the electrical contact apparatus 100, and may achieve the same function and effect as the apparatus 100 as described before.

In both of the electrical contact apparatus 100 and 170, the spacer 102 may be fitted in advance to the base plate 22 by means of screw members and/or proper adhesive. Also, the base 28 may be fitted in advance to the spacer 102 or the frame 104 by means of screw members and/or proper adhesive.

In the electrical contact apparatus 10 as shown in FIG. 1, which makes use of the lead portion 34 as a wiring portion, it is possible to use the probe element similar to the probe elements 50, 62, and 64 shown in FIGS. 3, 5, and 6, of which each is provided with a plurality of pyramid-shaped contactors 36 for every corresponding projection electrode 18.

Similarly to probe elements 50, 62, and 64 as indicated in FIGS. 3, 5, and 6, probe elements 70, 72, and 74 as indicated in FIGS. 20, 21, and 22 are provided with a circular seat portion 32 serving in place of the wiring portion 52, and four quadrilateral pyramid-shaped contactors 36, two quadrilateral pyramid-shaped contactors 36, and three triangular (three-faced) pyramid-shaped contactors 36, respectively. These contactors 36 are arranged about the center axis 48 of a corresponding projection electrode 18 at angular intervals.

As shown in FIG. 23, in any of these probe elements 70, 72, and 74, the seat portion 32 is provided with a circular plane land portion 76 arranged on the base 26 and a bump seat portion 78 projecting on the opposite side (downside) of the lead portion 34 and has a recess or an opening 56 between adjacent pyramid-shaped contactors 36.

The base 26 and the elastic body 28 have slits 38 and 40 surrounding the seat portion 32, respectively. The lead portion 34 includes a conductive core 80 such as a gold wire formed by means of the wire bonding technique and a coating layer 82 made of nickel or the like, for coating the core 80.

In the probe elements 70, 72, and 74, similar to the probe elements 50, 62, and 64, one edge line of four, two, or three contactors 36 is made to press the projection electrode 18. Therefore, the probe elements 70, 72, and 74 can provide the function and effect as described in connection with the probe elements 50, 62, and 64 with reference to FIG. 4. Still further, in the probe elements 70, 72, and 74, one slant surface of the contactor 36 may be made to press the projection electrode 18 instead of one edge line thereof.

Needless to say, the invention should not be limited to the embodiments as have been described so far. Those who have an ordinary skill in the art may variously change and modify the above-mentioned embodiments without departing from the gist of the invention.

What is claimed is:

1. An electrical contact apparatus for bringing a contactor into electrical contact with a corresponding projection electrode of a semiconductor device in a semiconductor device inspection equipment, comprising:

a plate-like or filmy base, and one or more pyramid-shaped contactors provided per projection electrode and projecting out from one surface of said base toward said semiconductor device, and a base plate provided with a plurality of wiring portions each corresponding to one of said projection electrodes and being exposed at least in part to the one surface side of said base plate, wherein said pyramid-shaped contactor is displaced in a predetermined direction in a plane parallel to said base with respect to said corresponding projection electrode, said base having a plurality of pyramid-shaped auxiliary contactors formed on the other surface side, said auxiliary contactors being brought into electrical contact with their corresponding wiring portions of said base plate and also with said pyramid-shaped contactors as well.

2. An apparatus as claimed in claim 1 wherein one pyramid-shaped contactor is provided for one projection electrode.

3. An apparatus as claimed in claim 1 wherein a plurality of pyramid-shaped contactors are provided per projection electrode such that said contactors are arranged around the center axis of said projection electrode at angular intervals.

4. An apparatus as claimed in claim 3 wherein said plural pyramid-shaped contactors for said projection electrodes direct one edge line or one slant surface thereof to said center axis.

5. An apparatus as claimed in claim 4 wherein said base is provided with an opening which is formed in an area inside the arrangement area of said plural pyramid-shaped contactors and opened toward at least said corresponding projection electrode.

6. An apparatus as claimed in claim 4 further comprising one or more wiring portions provided on said base and electrically connected with said pyramid-shaped contactor.

7. An apparatus as claimed in claim 1 wherein one or more said pyramid-shaped contactors are fitted to a seat portion arranged on said base.

8. An apparatus as claimed in claim 1 further comprising a frame arranged on said one surface side of said base plate, said base being fitted to said base plate such that said pyramid-shaped contactor comes on said frame side.

9. An apparatus as claimed in claim 8 wherein said frame has an opening for receiving said semiconductor device.

10. An apparatus as claimed in claim 1 further comprising a plate-like spacer arranged between said base and said base plate.

11. An apparatus as claimed in claim 1 further comprising a rubber plate arranged between the arrangement place of said auxiliary contactor on said base and said frame.

* * * * *